(12) United States Patent
Han

(10) Patent No.: US 6,821,877 B1
(45) Date of Patent: Nov. 23, 2004

(54) METHOD OF FABRICATING METAL INTERCONNECTION OF SEMICONDUCTOR DEVICE

(75) Inventor: Jae Won Han, Gyeonggi-do (KR)

(73) Assignee: Anam Semiconductor Inc., Seoul (KR)

( * ) Notice: Subject to any disclaimer, the term of this patent is extended or adjusted under 35 U.S.C. 154(b) by 0 days.

(21) Appl. No.: 10/747,664

(22) Filed: Dec. 30, 2003

(30) Foreign Application Priority Data

Jun. 24, 2003 (KR) .................................. 10-2003-0041022

(51) Int. Cl.[7] .............................................. H01L 21/44
(52) U.S. Cl. ....................... 438/612; 438/614; 438/617
(58) Field of Search .......................... 438/14, 612, 613, 438/614, 617, 977, FOR 343

(56) References Cited

U.S. PATENT DOCUMENTS

| | | | |
|---|---|---|---|
| 5,380,401 A | | 1/1995 | Jones et al. |
| 5,661,082 A | | 8/1997 | Hsu et al. |
| 5,814,893 A | | 9/1998 | Hsu et al. |
| 5,920,081 A | | 7/1999 | Chen et al. |
| 6,046,101 A | * | 4/2000 | Dass et al. .................. 438/624 |
| 6,162,652 A | * | 12/2000 | Dass et al. ................... 438/18 |
| 6,413,576 B1 | | 7/2002 | Ellis et al. |
| 6,426,556 B1 | * | 7/2002 | Lin ............................. 257/738 |
| 6,705,512 B2 | * | 3/2004 | Ho et al. .................. 228/180.5 |
| 6,765,277 B2 | * | 7/2004 | Chen et al. ................. 257/459 |
| 6,767,751 B2 | * | 7/2004 | Hunter ........................... 438/5 |

\* cited by examiner

Primary Examiner—George Fourson
Assistant Examiner—Michelle Estrada
(74) Attorney, Agent, or Firm—Pillsbury Winthrop LLP

(57) ABSTRACT

A method of fabricating a metal interconnection of semiconductor device is disclosed. A metal interconnection fabricating method according to the present invention comprises the steps of forming a metal interconnection by depositing and patterning a metal layer on a substrate with some predetermined structures; forming a passivation layer over the substrate including the metal interconnection; performing a thermal treatment process for the substrate with the passivation layer; forming a bond pad by selectively etching the passivation layer so that some portion of the metal interconnection is exposed; performing a probe test through the bond pad after grinding the back side of the substrate with the bond pad; and bonding a wire to the bond pad to connect the bond pad with an external circuit. The metal interconnection fabricating method performs a thermal treatment process prior to the formation of the bond pad opening. Therefore, the method can settle the problem that the bond pad is contaminated by materials outgassed from baking equipment or oxidized by thermal energy, thereby improving reliability of semiconductor device.

7 Claims, 4 Drawing Sheets

METHOD OF FABRICATING METAL INTERCONNECTION OF SEMICONDUCTOR DEVICE

BACKGROUND OF THE INVENTION

1. Field of the Invention

The present invention relates to a method of fabricating a metal interconnection of semiconductor device and, more particularly, to a metal interconnection fabricating method comprising the step of performing a thermal treatment process prior to formation of bond pad openings.

2. Background of the Related Art

Generally, semiconductor products are manufactured through a wafer fabrication process, a semiconductor fabrication process, and an assembly process. In the semiconductor fabrication process, a process of forming a bond pad may be a final step. The bond pad is electrically coupled to a metal interconnection, and plays a role of a channel connecting electrically semiconductor devices formed on a semiconductor substrate with external devices. A passivation layer to protect the semiconductor devices formed on the substrate is formed after the formation of the bond bad. Then, openings to expose the bond pad are formed by removing some portion of the passivation layer.

FIGS. 1a through 1e illustrate, in cross-sectional views, the process steps for forming bond pad openings according to a prior art. Referring to FIG. 1a, an underlying layer 11 on a semiconductor substrate having some predetermined devices is provided and a metal interconnection 12 is formed on the underlying layer 11. An interlayer dielectric 13 is formed over the metal interconnection 12 and the underlying layer 11. Some portion of the interlayer dielectric 13 is removed to expose some portion of the metal interconnection 12. A bond pad 14, which is coupled to the metal interconnection 12 exposed, is formed. Then, a passivation layer 15 is formed over the all structures including the bond pad 14. The bond pad 14 generally comprises a metal layer 14a and a top metal layer 14b to form a multi-layered structure. The passivation layer 15 comprises oxide 15a such as PSG and nitride 15b.

Referring to FIG. 1b, a photoresist pattern 16 to make bond pad openings is formed on the passivation layer 15. Referring to FIG. 1c, in a first etching process, the nitride 15b is etched using the photoresist pattern 16 as an etch mask. The nitride 15b is etched by plasma etch using a mixture gas of $CF_4$ gas and $O_2$ gas. Then, as shown in FIG. 1d, in a second etching process, the oxide 15a is etched using the photoresist pattern 16 as an etch mask and, successively, the top metal layer 14b of the bond pad 14 is etched. Therefore, the metal layer 14a of the bond pad 14 is exposed to form a bond pad opening 17. The oxide 15a and the top metal layer 14a are etched by plasma etch using a mixture gas of $CF_4$ gas, Ar gas, and $N_2$ gas.

Referring to FIG. 1e, the photoresist pattern 16 is removed by plasma etch using $O_2$ gas. A development treatment process using basic organics is performed to remove polymer remaining on the metal layer 14a of the bond pad 14. Then, the formation of bond pad opening is completed.

Subsequently, a baking process is performed for the substrate with the bond pad opening. Here, the bond pad which is exposed to an electric furnace or an oven during the baking process is easily contaminated by materials outgassed from baking equipment or oxidized by thermal energy. A semiconductor device having the bond pad contaminated by organic materials cannot be used.

The organic materials are likely to be outgassed from the baking equipment. Particularly, in case of applying a process of baking the bond pad for 72 hours at 200° C., the contamination of the bond pad causes a very serious trouble. That is, the contaminated bond pad makes it impossible to perform a probe test and, therefore, the quality of semiconductor device fabricated cannot be measured. In addition, since it is impossible to perform wire bonding for the contaminated bond pad, a semiconductor device with the contaminated bond pad cannot be used.

SUMMARY OF THE INVENTION

Accordingly, the present invention is directed to a method of fabricating a metal interconnection of semiconductor device that substantially obviates one or more problems due to limitations and disadvantages of the related art.

An object of the present invention is to provide a method of fabricating a metal interconnection that can settle the problem that a bond pad is easily contaminated by materials outgassed from baking equipment or oxidized by thermal energy, by performing a thermal treatment process prior to the formation of bond pad openings.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a metal interconnection of semiconductor device according to the present invention comprises the steps of:

forming a metal interconnection by depositing and patterning a metal layer on a substrate with some predetermined structures;

forming a passivation layer over the substrate including the metal interconnection;

performing a thermal treatment process for the substrate with the passivation layer;

forming a bond pad by selectively etching the passivation layer so that some portion of the metal interconnection is exposed;

performing a probe test through the bond pad after grinding back side of the substrate with the bond pad; and bonding a wire to the bond pad to connect the bond pad with an external circuit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
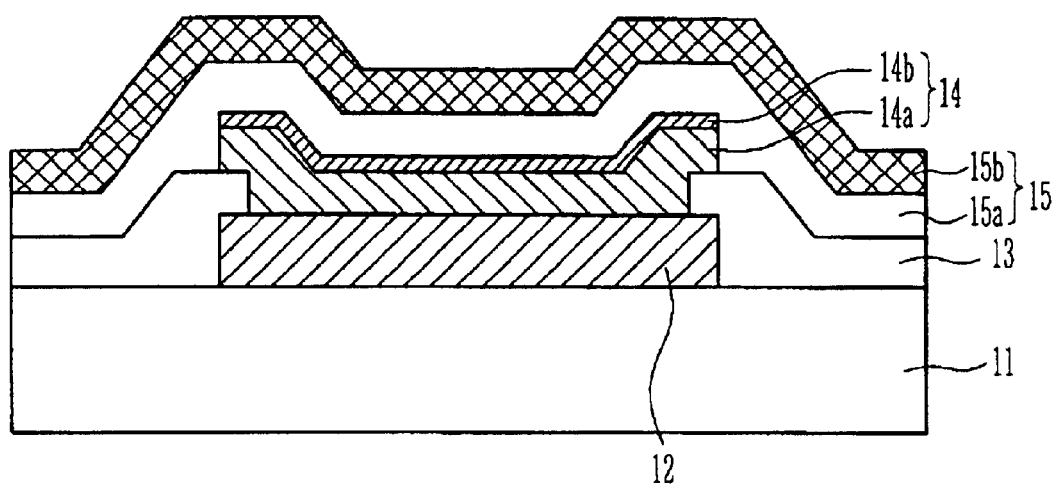
FIGS. 1a through 1e illustrate, in cross-sectional views, the process steps for forming a bond pad opening according to a prior art.
Figure 1B:
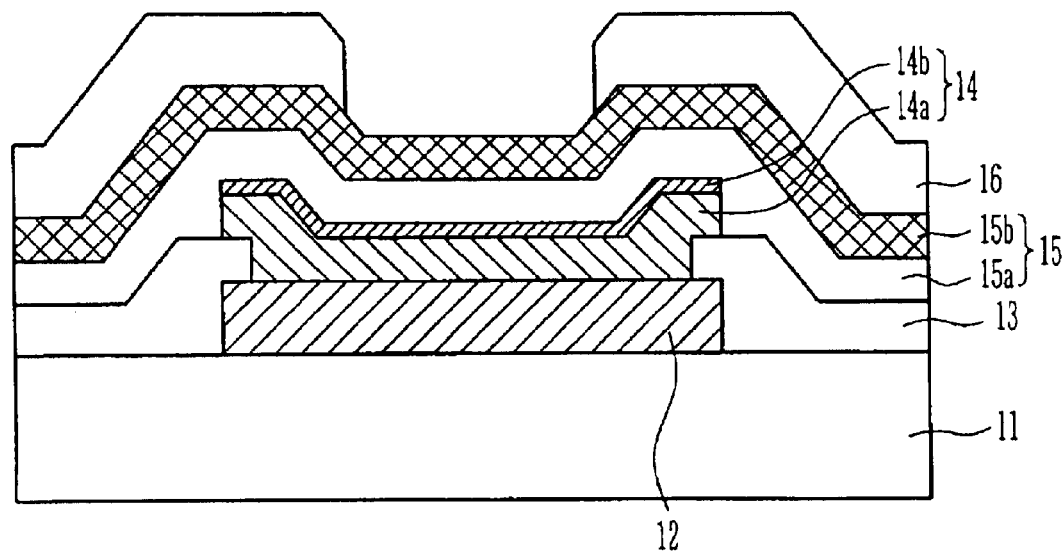
Figure 1C:
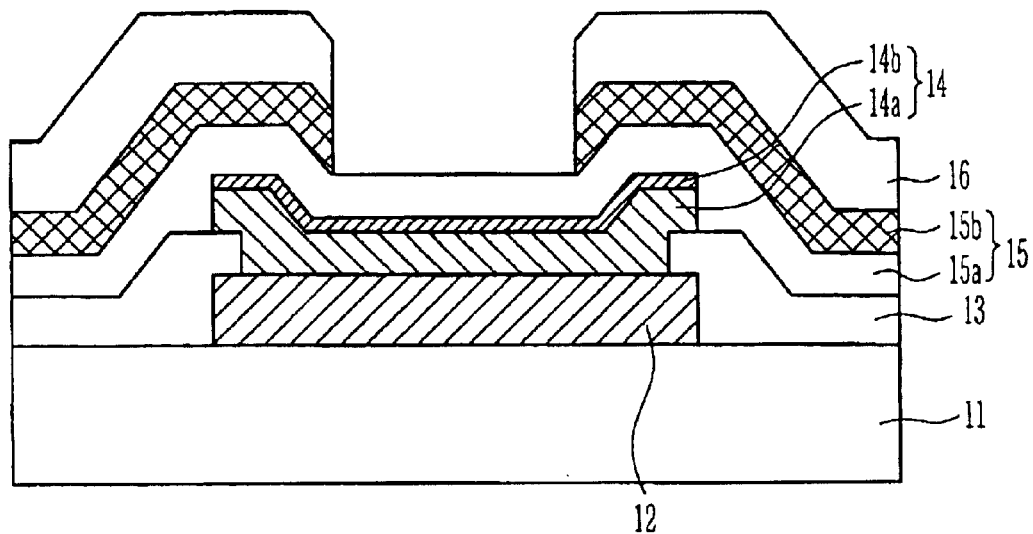
Figure 1D:
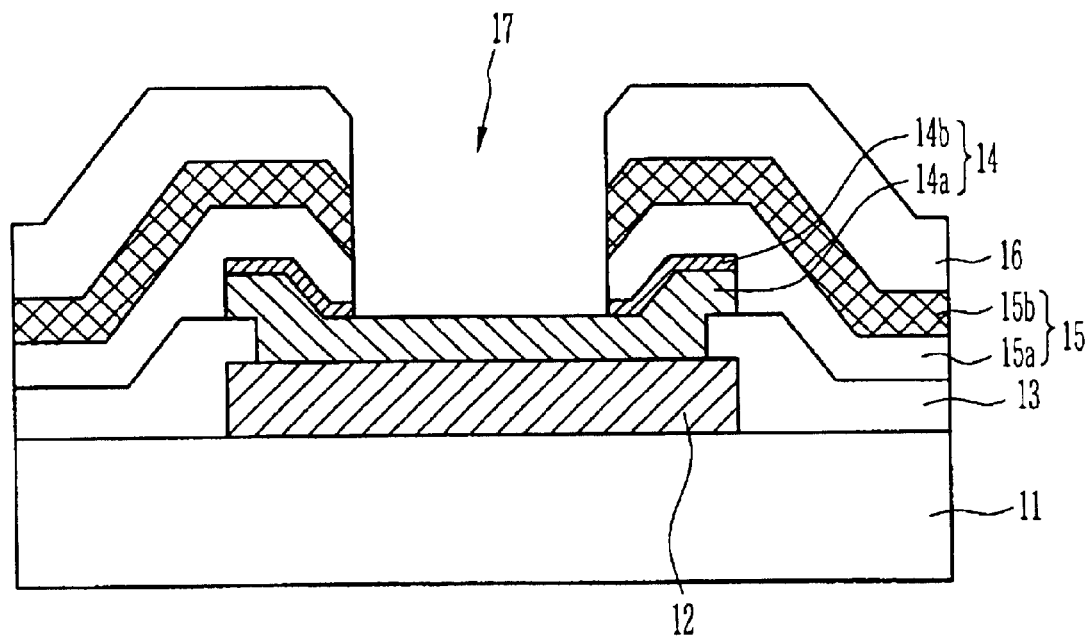
Figure 1E:
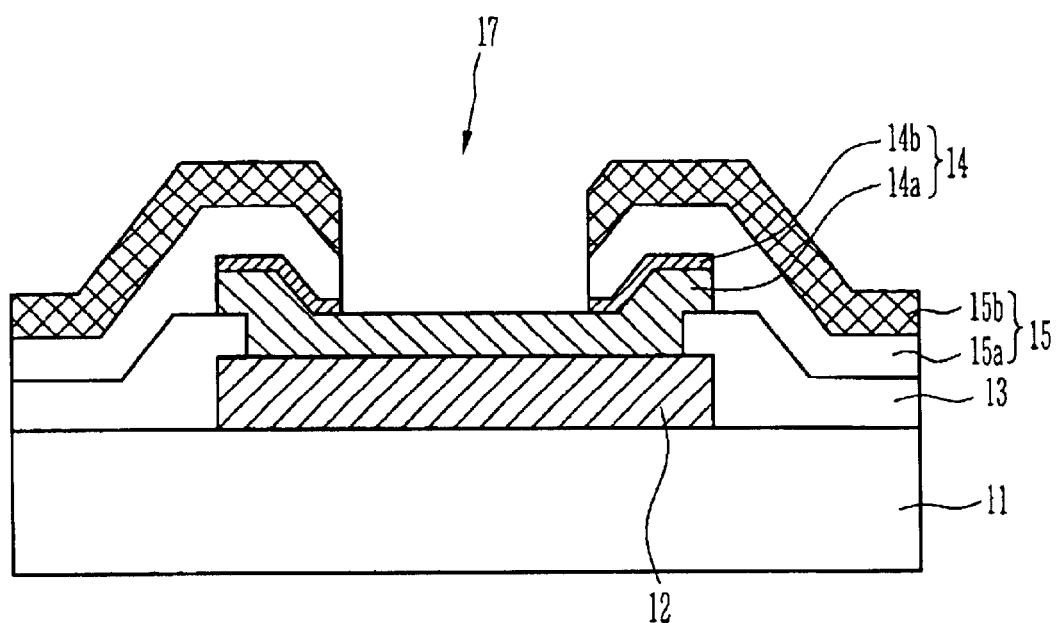
Figure 2A:
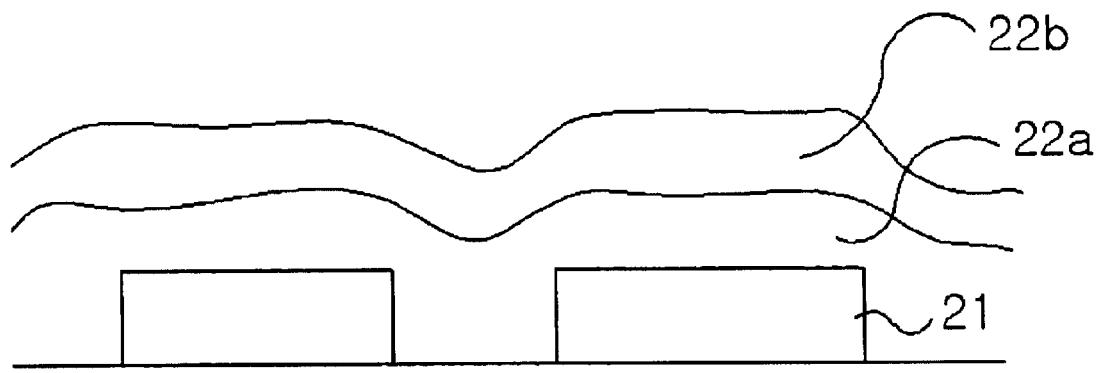
FIGS. 2a through 2c illustrate, in cross-sectional views, the process steps for forming a bond pad opening according to the present invention.

Referring to FIG. 2a, a metal layer 21 is formed on the surface of a substrate having some predetermined structures. Then, the metal layer 21 is patterned by a photolithography process, and passivation layers 22a and 22b are formed on the substrate patterned. The metal layer 21 comprises a bottom barrier metal, an aluminum alloy, and an upper barrier metal. The bottom barrier metal is Ti, TiN or Ti/TiN. The upper barrier metal is Ti or TiN. The metal layer 21 has a multi-layered structure where the metals are deposited in order of Ti, TiN, an aluminum alloy, and TiN, or in order of Ti, an aluminum alloy, and TiN. The aluminum alloy is one selected from the group of Al, alloys consisting of aluminum and Cu of 0.2~1.0%, alloys consisting of aluminum, Cu of 0.2~1.0%, and Si of 0.5~2.0%, and alloys consisting of aluminum and Si of 0.5~2%. The passivation layer 22a and 22b are formed by depositing an oxide insulating layer 22a and a nitride insulating layer 22b in sequence.

Figure 2B:
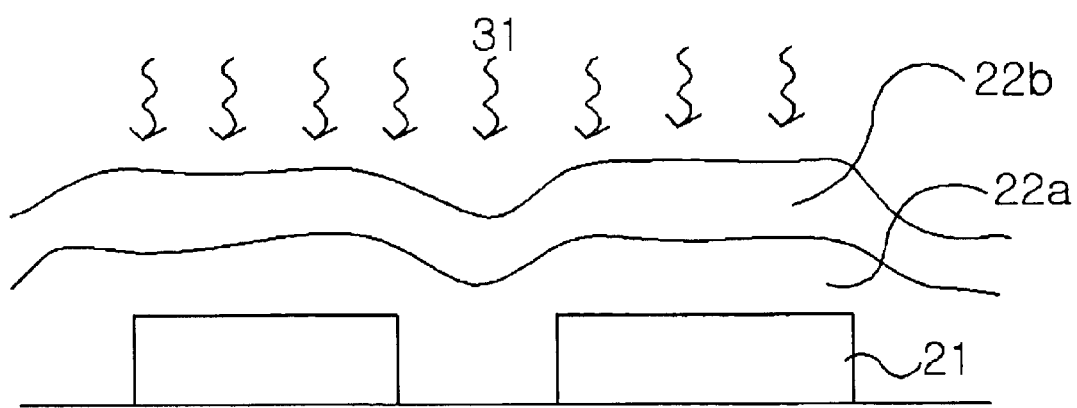

FIG. 2b shows a thermal treatment process. The thermal treatment process is a sintering process, a baking process or a combination of the sintering process and the baking process.

A distinctive feature of the present invention is to perform a thermal treatment process prior to the formation of the bond pad openings. This method has not been used in conventional arts because of a possibility of a particle problem in patterning. However, the present invention does not cause the particle problem although the bond pad opening is formed after the thermal treatment process. The sintering process is performed in an electric furnace at a temperature of 350~450° C. for 10~50 minutes. The baking process is performed in an electric furnace at a temperature of 150~250° C. for 48~80 hours.

Figure 2C:
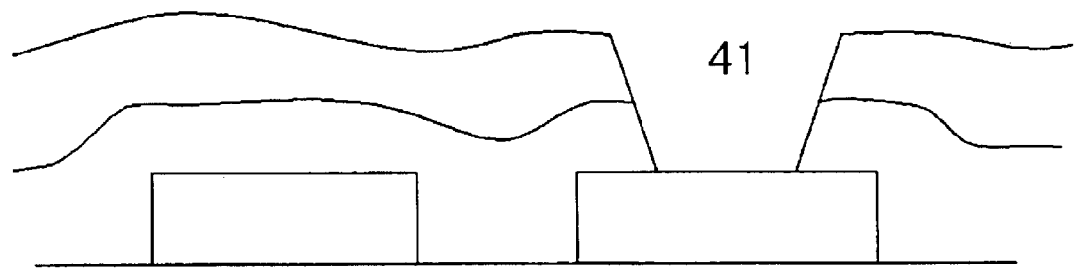

FIG. 2c shows the process for forming a bond pad opening. A photoresist pattern is formed on the passivation layer 22b. The bond pad opening 41 is formed by etching the passivation layers 22a and 22b using the photoresist pattern as a etch mask. The passivation layers 22a and 22b are removed by a dry etch process. Then, the photoresist pattern is removed by plasma etch using $O_2$ gas to complete the bond pad opening.

Subsequently, back side of the substrate with the bond pad opening is grinded, and, a probe test is performed for devices on the substrate grinded. The grinding and the probe test are performed through an in-situ process immediately after the formation of the bond pad opening. Next, the metal interconnection of semiconductor device is formed through bonding a wire to the bond pad at the bond pad opening.

Accordingly, a method of fabricating a semiconductor device according to the present invention performs a thermal treatment process prior to the formation of the bond pad opening. Therefore, the method can settle the problem that the bond pad is contaminated by materials outgassed from baking equipment or oxidized by thermal energy, thereby improving reliability of semiconductor device.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a metal interconnection of semiconductor device comprising the steps of:

forming a metal interconnection by depositing and patterning a metal layer on the surface of a substrate having some predetermined structures;

forming a passivation layer over the substrate including the metal interconnection;

performing a thermal treatment process for the substrate with the passivation layer;

forming a bond pad by selectively etching the passivation layer so that some portion of the metal interconnection is exposed;

performing a probe test through the bond pad after grinding back side of the substrate with the bond pad; and bonding a wire to the bond pad to connect the bond pad with an external circuit.

2. The method as defined as claim 1, wherein the step of forming a passivation layer comprises the steps of depositing an oxide on the surface of the substrate and depositing a nitride on the oxide.

3. The method as defined by claim 1 or claim 2, wherein the metal layer comprises a bottom barrier metal, an aluminum alloy, and an upper barrier metal, the bottom barrier metal being selected from the group of Ti, TiN, and Ti/TiN, the upper barrier metal being selected from the group of Ti and TiN.

4. The method as defined by claim 1 or claim 2, wherein the thermal treatment process is a sintering process, a baking process, or a combination of the sintering process and the baking process.

5. The method as defined by claim 4, wherein the sintering process is performed at a temperature of 350~450° C. for 10~50 minutes.

6. The method as defined by claim 4, wherein the baking process is performed at a temperature of 150~250° C. for 48~80 hours.

7. The method as defined by claim 1 or claim 2, wherein the grinding and the probe test are performed through an in-situ process immediately after the formation of the bond pad.

* * * * *